United States Patent
Egawa

[11] Patent Number: 5,994,168
[45] Date of Patent: *Nov. 30, 1999

[54] METHOD OF MANUFACTURING SEMICONDUCTOR DEVICE

[75] Inventor: Yoshimi Egawa, Tokyo, Japan

[73] Assignee: Oki Electric Industry Co., Ltd., Tokyo, Japan

[ * ] Notice: This patent is subject to a terminal disclaimer.

[21] Appl. No.: 09/195,203

[22] Filed: Nov. 18, 1998

Related U.S. Application Data

[63] Continuation of application No. 08/940,954, Oct. 8, 1997, Pat. No. 5,863,815.

[30] Foreign Application Priority Data

Feb. 25, 1997  [JP]  Japan ................................ 9-040252

[51] Int. Cl.$^6$ ...................................................... H01L 21/44
[52] U.S. Cl. .......................... 438/118; 438/105; 438/126
[58] Field of Search ................................... 438/108, 118, 438/126, 127

[56] References Cited

U.S. PATENT DOCUMENTS 5,468,681  11/1995  Pasch .
5,489,804  2/1996  Pasch .
5,710,071  1/1998  Beddingfield et al. .
5,863,815  1/1999  Egawa ....................................... 438/118

FOREIGN PATENT DOCUMENTS 7-106357  4/1995  Japan .

Primary Examiner—Kevin M. Picardat
Attorney, Agent, or Firm—Jones Volentine, LLP

[57] ABSTRACT

A method of manufacturing a semiconductor device which allows reliability of connection to be improved and manufacturing time to be reduced includes sandwiching a sheet-shaped unhardended hardenable material between a semiconductor chip and an interposer or substrate. The hardenable material is then melted, thereby bonding the semiconductor chip and the interposer, the surface of the semiconductor chip opposite the interposer being covered with the hardening resin. The hardenable material is then hardened in an appropriate manner.

9 Claims, 5 Drawing Sheets

METHOD OF MANUFACTURING SEMICONDUCTOR DEVICE

CROSS-REFERENCE TO RELATED APPLICATIONS

This is a continuation application of application Ser. No. 08/940,954, filed Oct. 8, 1997, now U.S. Pat. No. 5,863,815, the entire contents of which are hereby incorporated by reference.

BACKGROUND OF THE INVENTION

1. Field of the Invention

The present invention relates to a method of manufacturing a semiconductor device having a semiconductor chip loaded thereon and, more particularly, to a method of manufacturing, for example, a semiconductor device having a CSP (Chip Size (Scale) Package) structure.

2. Description of the Related Art

The trend toward smaller packages of semiconductor devices and the increase in the number of connection terminals have resulted in smaller intervals between connection terminals of semiconductor devices, and it becomes difficult to manufacture such semiconductor devices using conventional technique utilizing soldering. Under such circumstances, a method has been contemplated in which a bare semiconductor device is directly mounted on a circuit substrate in an attempt to achieve a smaller packaging area and to utilize such an area more efficiently. For example, such a device is disclosed in Japanese Patent Application Laid-Open No. 7-106357.

In a conventional semiconductor device of this type, a semiconductor chip is connected on to an interposer (substrate) and, in order to protect the semiconductor chip from the external environment, resin sealing is achieved by thermally hardening (curing) liquid resin filled in the gap between the semiconductor chip and the interposer.

However, such a conventional method of manufacturing a CSP structure has had a problem in that large voids and unfilled regions are formed inside when the gap between the semiconductor chip and the interposer is filled with liquid resin because such a gap is small (100 $\mu$m).

Further, since resin sealing is performed by filling the gap with liquid resin and then curing it, liquid resin must be slowly charged in order to prevent the occurrence of voids and the like as described above. There is, therefore, the disadvantage that the curing of liquid resin takes a very long time.

As described above, problems have arisen in that the occurrence of voids and unfilled regions reduces reliability of connection and manufacturing time is prolonged because of the need for charging and curing liquid resin.

SUMMARY OF THE INVENTION

It is an object of the invention to provide a method of manufacturing a semiconductor device in which the reliability of connection can be improved and the manufacturing time can be reduced.

According to an aspect of the present invention, there is provided a method of manufacturing a semiconductor device wherein a semiconductor device is connected to connection terminals provided on a surface of a substrate and the semiconductor device is bonded on to the substrate, comprising the steps of:

first placing sheet-shaped hardening resin on the substrate; and bonding the semiconductor device to the connection terminals such that the hardening resin is sandwiched therebetween and simultaneously sealing the semiconductor device on the substrate with the hardening resin.

According to another aspect of the present invention, there is provided a method of manufacturing a semiconductor device wherein a semiconductor device is connected to connection terminals provided on a surface of a substrate and the semiconductor device is bonded on to the substrate, comprising the steps of:

first placing sheet-shaped thermosetting resin on the substrate; and bonding the semiconductor device to the connection terminals such that the thermosetting resin is sandwiched therebetween and sealing the semiconductor device on the substrate by heating and hardening the thermosetting resin.

According to the method of manufacturing a semiconductor device of the present invention, sheet-shaped hardening resin is first placed on a substrate; the semiconductor device is bonded to connection terminals such that the thermosetting resin is sandwiched therebetween; and, simultaneously, the semiconductor device is sealed on the substrate with the thermosetting resin This makes it possible to prevent the occurrence of unfilled regions and internal voids and to generally reduce manufacturing time.

According to another aspect of the present invention, there is provided a method of manufacturing a semiconductor device comprising the steps of:

placing sheet-shaped hardening resin on a substrate;

bonding a semiconductor chip to said substrate such that said hardening resin is sandwiched between said semiconductor chip and said substrate with connection terminals provided on the surface of said substrate interposed therebetween; and thereafter, sealing said semiconductor chip on said substrate with said hardening resin;

thereby bonding said semiconductor chip to said substrate with said connection terminals and said hardening resin interposed therebetween.

Furthermore, according to the other aspect of the present invention, there is provided a method of manufacturing a semiconductor device comprising the steps of:

bonding a semiconductor chip to a substrate with connection terminals provided on a surface of said substrate interposed therebetween;

thereafter, placing sheet-shaped hardening resin between said semiconductor chip and said substrate and on said substrate;

thereafter, sealing said semiconductor chip on said substrate with said hardening resin;

thereby bonding said semiconductor chip to said substrate with said connection terminals and said hardening resin interposed therebetween.

DETAILED DESCRIPTION OF THE PREFERRED EMBODIMENTS

The present invention will now be described in detail.

Hardening resin according to the present invention may be formed to a thickness corresponding to the thickness of connection terminals. Alternatively, the hardening resin may include clearance holes for adjusting the amount of resin during resin sealing provided at the positions of the connection terminals.

The hardening resin according to the present invention may include a guard ring provided in a peripheral region thereof for preventing the resin from flowing out during resin sealing. Alternatively, the hardening resin may include recesses for alignment, and protrusions for cooperating with the recesses to achieve alignment may be provided on the surface of a substrate that faces the recesses.

The hardening resin according to the present invention may be a thermosetting resin, a thermoplastic resin, or a UV-hardening resin. Further, the hardening resin may be hardening resin in a solid state.

The method of manufacturing a semiconductor device according to the present invention is applicable to a CSP semiconductor device in which a semiconductor chip is connected. While the method of manufacturing a semiconductor device will now be described with reference to preferred embodiments thereof, those embodiments are only illustrative and should not be construed as limiting the present invention.

EXAMPLES

Example 1

Figure 1:
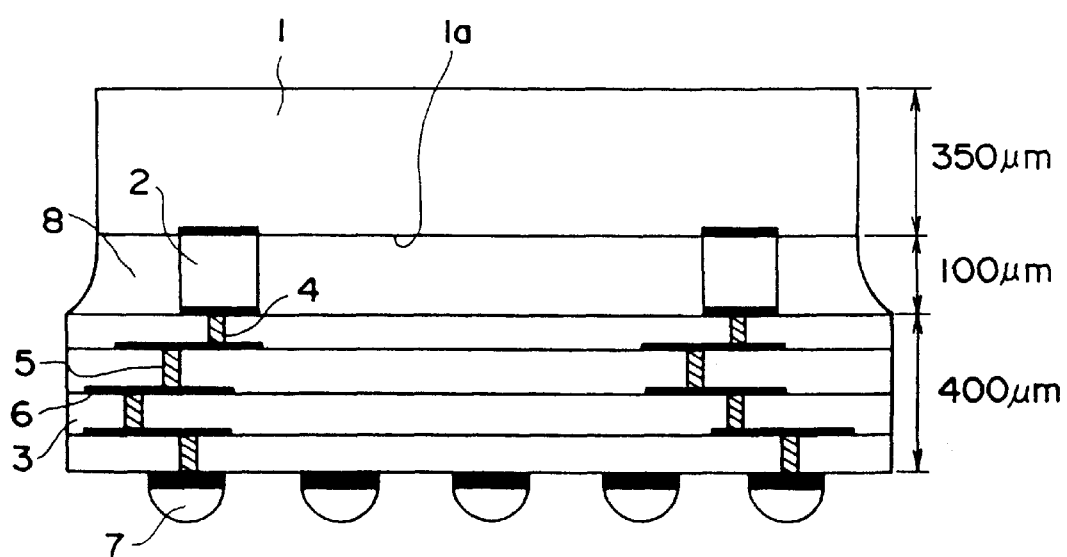
FIG. 1 is a sectional view of a finished device showing a CSP structure obtained by a method of manufacturing a semiconductor device according to the first embodiment of the present invention.
Figure 2:
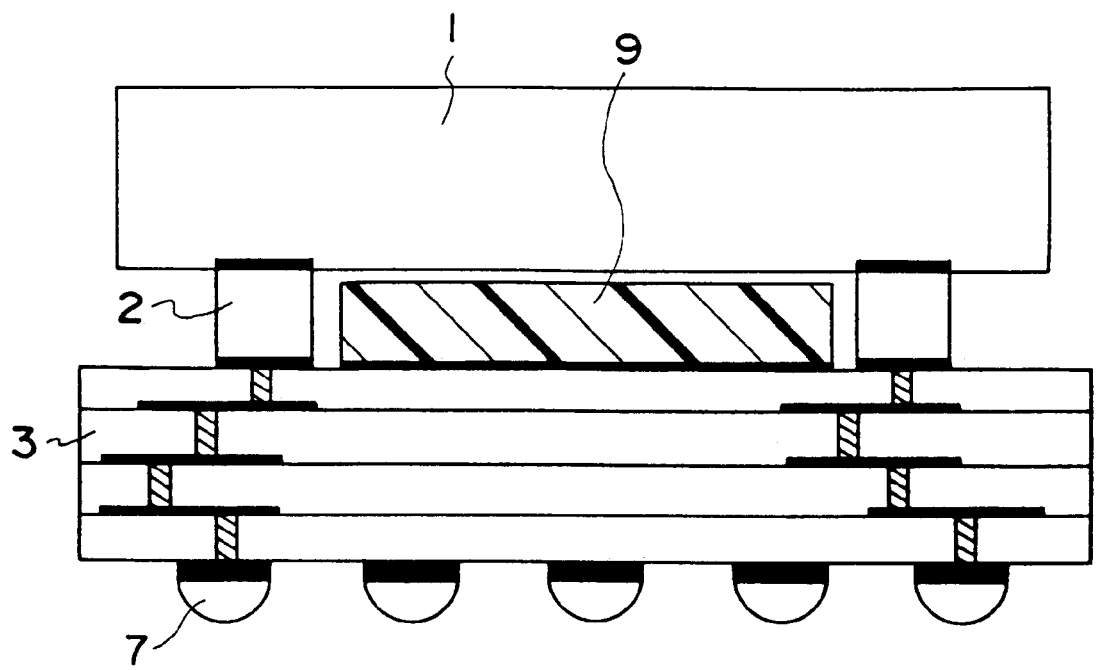
FIG. 2 is a sectional view showing the CSP structure in FIG. 1 prior to hardening of resin.

FIGS. 1 and 2 show a CSP structure obtained by a method of manufacturing a semiconductor device according to the first embodiment of the present invention. FIG. 1 is a sectional view of a finished device in which resin has already been hardened. FIG. 2 is a sectional view showing the structure before the resin has hardened.

In FIG. 1, 1 designates a semiconductor chip; 2 designates internal connection terminals for electrically connecting the semiconductor chip and a substrate; 3 designates an interposer (substrate) constituted by a multilayer substrate; 4 designates via holes formed in the multilayer substrate; 5 designates metal plugs filled in the via holes 4; 6 designates upper layer wiring for electrically connecting the metal plugs 5 and the like; 7 designates external terminals constituted by solder balls; and 8 designates under-filler-resin (hardening resin or thermosetting resin) which has been thermally hardened. As used herein, the term "under-filler-resin" means a resin which fills the gaps between the semiconductor chip and the substrate. The thickness of the semiconductor chip 1, internal connection terminals 2, and interposer 3 are 350 $\mu$m, 100 $\mu$m, and 400 $\mu$m, respectively.

Specifically, this semiconductor device has a structure in which a lower surface 1a of the semiconductor chip 1 and the interposer (substrate) 3 are connected through the conductive internal connection terminals 2; the gap between the lower surface 1a of the semiconductor chip 1 and the interposer (substrate) 3 is sealed with the thermally hardened under-filler-resin 8; and the external terminals (solder balls) 7 are provided on a lower surface of the interposer (substrate) 3.

More specifically, this semiconductor device is formed by placing the unhardened under-filler-resin 9 (FIG. 2) in the form of a sheet having a thickness of 100 $\mu$m which corresponds to the thickness of the internal connection terminals 2 (100 $\mu$m) on the interposer (substrate) 3 in a region where the internal connection terminals 2 are not provided by thermally hardening it after contact-bonding the semiconductor chip 1 thereon.

The unhardened under-filler-resin 9 described above is thermosetting resin in the form of a sheet which is prepared in advance in conformity with the shapes of the semiconductor chip 1 and internal connection terminals 2 and the thickness of the internal connection terminal 2 and is in a solid or semisolid state before being hardened. Thus, the sheet-shaped unhardened under-filler-resin 9 can be easily placed on the interposer (substrate) 3.

Further, the unhardened under-filler-resin 9 is thermally hardened (at 100 to 200° C.) into thermally hardened under-filler-resin 8 in a solid state of high rigidity which bonds the semiconductor chip 1 and the interposer (substrate) 3 and provides sealing therebetween.

A method of manufacturing a CSP structure having the above-described structure will now be described.

FIG. 2 is a diagram of the method of manufacturing the CSP structure.

First, the internal connection terminals 2 are mounted on input/output terminals of the semiconductor chip 1. For example, the internal connection terminals 2 may be gold bumps, gold stud bumps, or solder bumps. The internal connection terminals 2 and the interposer (substrate) 3 may be connected using conductive adhesive (e.g., copper paste, silver paste, etc.), Au—Au bonding, solder bonding, or any other conventionally known method.

Prior to bonding the interposer (substrate) 3 having the internal connection terminals 2 mounted thereon and the semiconductor chip 1, the sheet-shaped unhardened under-filler-resin 9 is sandwiched into the gap therebetween. Specifically, since the unhardened under-filler-resin 9 is a thermosetting resin in the form of a sheet which is prepared in advance in conformity with the shapes of the semiconductor chip 1 and internal connection terminals 2 and the thickness of the internal connection terminal 2, it can be accurately placed on the interposer (substrate) 3 having the internal connection terminals 2 mounted thereon as shown in FIG. 2. In this state, the semiconductor chip 1 is placed on the internal connection terminals 2 and the unhardened under-filler-resin 9 and is contact-bonded thereto after being appropriately positioned.

Thereafter, the semiconductor device is heated (at 100 to 200° C.) to melt and thermally harden the under-filler-resin 9, and the semiconductor chip 1 and the interposer (substrate) 3 are sealed with the under-filler-resin 8 obtained as a result of the thermal hardening.

As described above, in the method of manufacturing a semiconductor device according to the first embodiment of the invention, unhardened under-filler-resin 9 in the form of a sheet sandwiched between a semiconductor chip 1 and an interposer (substrate) 3 is melted and thermally hardened, and the semiconductor chip 1 and the interposer (substrate) 3 are sealed with the under-filler-resin 8 obtained as a result of the thermal hardening. This makes it possible to completely prevent the occurrence of the unfilled regions and internal voids encountered in conventional dispensing processes.

Further, filling with liquid resin in the prior art is performed slowly and involves a long period of time; 2 to 3 hours for thermally hardening the liquid resin. A significant reduction in manufacturing time can be made in the present embodiment because the unhardened under-filler-resin 9 can be thermally hardened in a matter of seconds.

Example 2

Figure 3A:
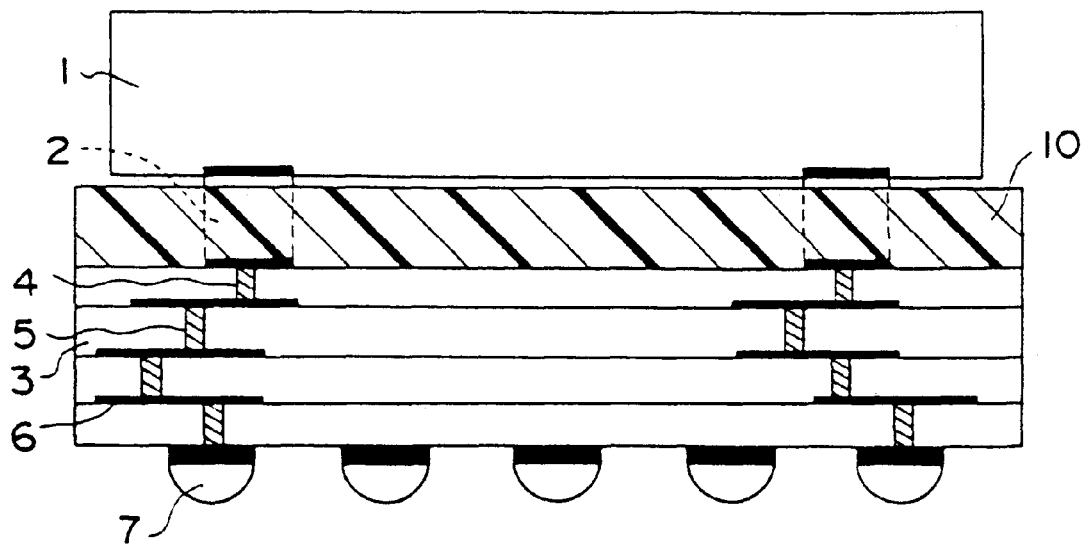
FIGS. 3A and 3B are sectional views of a CSP structure obtained by a method of manufacturing a semiconductor device according to the second embodiment of the present invention.
Figure 3B:
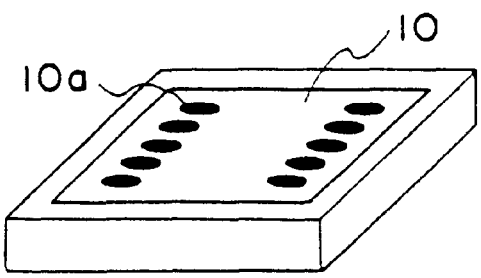

FIG. 3A and 3B are diagrams of a CSP structure of a semiconductor device according to the second embodiment of the present invention. In the description of the semiconductor device of the present embodiment, the same components as those in the semiconductor device shown in FIGS. 1 and 2 of example 1 are indicated by the same reference numbers.

In FIGS. 3A and 3B, 1 designates a semiconductor chip; 2 designates internal connection terminals for electrically connecting the semiconductor chip and a substrate; 3 designates an interposer (substrate) constituted by a multilayer substrate; 4 designates via holes formed in the multilayer substrate; 5 designates metal plugs; 6 designates upper layer wiring; 7 designates external terminals (solder balls); and 10 designates the unhardened under-filler-resin.

The unhardened under-filler-resin 10 is a thermosetting resin in the form of a sheet having a thickness corresponding to the thickness (height) of the internal connection terminals 2 and has a configuration including clearance holes 10a having a shape similar to that of the internal connection terminals 2 terminals, provided in the positions of the terminals as shown in FIG. 3B. Further, the unhardened under-filler-resin 10 is thermally hardened (at 100 to 200° C.) into thermally hardened under-filler-resin in a solid state of high rigidity which allows the semiconductor chip 1 and the interposer (substrate) 3 to be bonded and sealed.

A method of manufacturing a CSP structure having the above-described configuration will now be described.

First, the internal connection terminals 2 are mounted to input/output terminals of the semiconductor chip 1.

Then, the unhardened under-filler-resin 10 having the clearance holes 10a corresponding in shape to the internal connection terminals 2 (see FIG. 3B) is placed on the interposer (substrate) 3 having the internal connection terminals 2 mounted thereon. The clearance holes loa are formed in correspondence to the shape and position of the internal connection terminals 2. Further, the clearance holes 10a are formed to have a predetermined size which is larger than the size of the internal connection terminals 2. The size of the clearance holes 10a thus depends on the size of the internal terminals 2 and, in addition, depends on the characteristics of the resin used, e.g., the manner in which the resin spreads during hardening. This facilitates the loading of the unhardened under-filler-resin 10 and allows adjustment of the amount of resin. Specifically, when the amount of the sealing resin is excessive, the amount of the resin is adjusted by resin escaping to the regions of the clearance holes 10a or by an expansion of the regions of the clearance holes 10a. Thus, it is possible to perform appropriate contact bonding of the semiconductor chip 1 and interposer (substrate) 3.

Thereafter, the semiconductor device is heated (at 100 to 200° C.) to melt and thermally harden the under-filler-resin 10, and the semiconductor chip 1 and the interposer (substrate) 3 are sealed with the under-filler-resin 8 obtained as a result of the thermal hardening.

As described above, according to the method of manufacturing a semiconductor device of the second embodiment, since the unhardened under-filler-resin 10 is formed with the clearance holes 10a in the positions of the internal connection terminals 2, fine adjustment can be conducted on the amount of resin.

Example 3

Figure 4A:
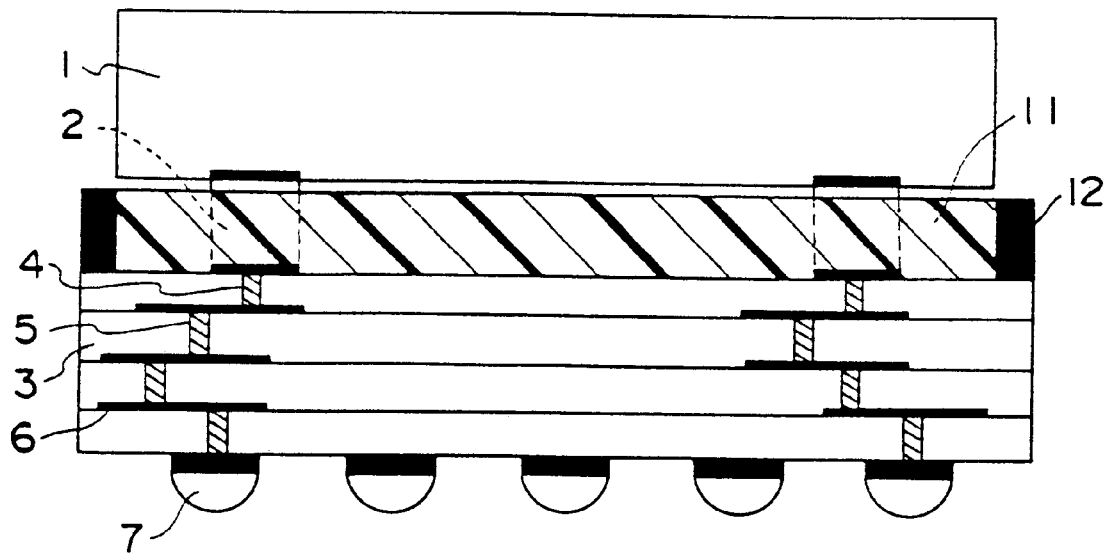
FIGS. 4A and 4B are sectional views of a CSP structure obtained by a method of manufacturing a semiconductor device according to the third embodiment of the present invention.
Figure 4B:
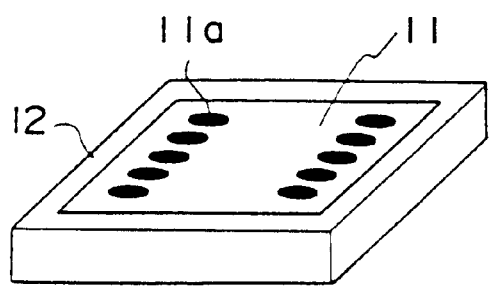

FIGS. 4A and 4B are views showing a CSP structure of a semiconductor device according to a third embodiment of the present invention. In the description of the semiconductor device of the present embodiment, the same components as those in the semiconductor device according to the second embodiment shown in FIGS. 3A and 3B of example 2 is indicated by the same reference numbers.

In FIGS. 4A and 4B, 1 designates a semiconductor chip; 2 designates internal connection terminals for electrically connecting the semiconductor chip and a substrate; 3 designates an interposer (substrate) made up of a multilayer substrate; 4 designates via holes formed in the multilayer substrate; 5 designates metal plugs; 6 designates upper layer wiring; 7 designates external terminals (solder balls); 11 designates unhardened under-filler-resin; and 12 designates a guard ring for preventing the resin from flowing out.

The unhardened under-filler-resin 11 is thermosetting resin in the form of a sheet having a thickness corresponding to the thickness (height) of the internal connection terminals 2 and has a configuration including clearance holes 11a having a shape similar to that of the internal connection terminals 2, provided in the positions of the terminals as shown in FIG. 4B.

The guard ring 12 is a guard ring for preventing the under-filler-resin 11 from flowing out when the resin is thermally melted. It is constituted by an insulator such as a polyimide tape and glass or a metal or the like which is usable at temperatures of up to about 300° C. and is formed so that it surrounds the outer periphery of the unhardened under-filler-resin 11.

A method of manufacturing a CSP structure having the above-described configuration will now be described.

First, the internal connection terminals 2 are mounted to input/output terminals of the semiconductor chip 1.

Then, the unhardened under-filler-resin 11 having the clearance holes 11a corresponding in shape to the internal connection terminals 2 (see FIG. 4B) is placed on the interposer (substrate) 3 having the internal connection terminals 2 mounted thereon. Like the unhardened under-filler-resin 10 in FIGS. 3A and 3B, the clearance holes 11a are formed in correspondence to the shape and position of the internal connection terminals 2 and are formed to have a predetermined size which is larger than the size of the internal connection terminals 2. Further, the guard ring 12 is provided around the outer periphery of the unhardened under-filler-resin 11.

Thereafter, the semiconductor device is heated (at 100 to 200° C.) to melt and thermally harden the under-filler-resin 11, and the semiconductor chip 1 and the interposer (substrate) 3 are sealed with the under-filler-resin 8 obtained as a result of the thermal hardening. At this time, since the guard ring 12 is provided around the unhardened under-filler-resin 11, it is possible to prevent the under-filler-resin 11 from flowing on to the interposer (substrate) 3 when the under-filler-resin 11 is melted. Further, this guard ring 12 may be removed after the assembly is completed.

As described above, according to the method of manufacturing a semiconductor device of the third embodiment, since the guard ring 12 is provided around the unhardened under-filler-resin 11, an advantage can be achieved in that it is possible to prevent the resin from flowing out when it is melted.

Example 4

Figure 5:
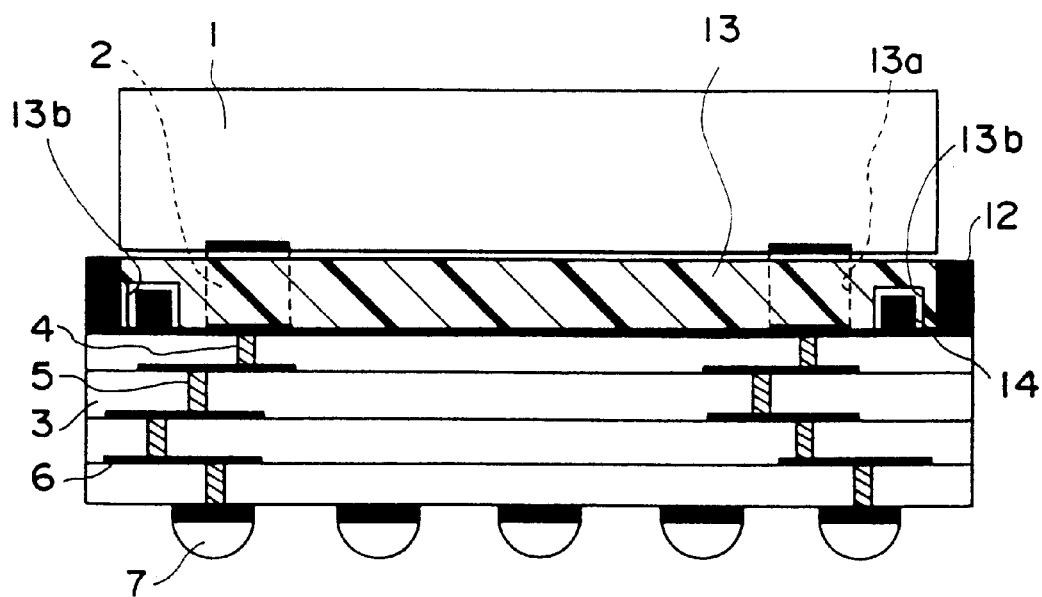
FIG. 5 is a sectional view of a CSP structure obtained by a method of manufacturing a semiconductor device according to the fourth embodiment of the present invention.

FIG. 5 is a view showing a CSP structure of a semiconductor device according to a fourth embodiment of the present invention. In the description of the semiconductor device of the present embodiment, the same components as those in the semiconductor device shown in FIGS. 4A and 4B are indicated by the same reference numbers.

In FIG. 5, 1 designates a semiconductor chip; 2 designates internal connection terminals for electrically connecting the semiconductor chip and a substrate; 3 designates an interposer (substrate) constituted by a multilayer substrate; 4 designates via holes formed in the multilayer substrate; 5 designates metal plugs; 6 designates upper layer wiring; 7 designates external terminals (solder balls); 13 designates unhardened under-filler-resin; and 12 designates a guard ring for preventing the resin from flowing out.

The unhardened under-filler-resin 13 is thermosetting resin in the form of a sheet having a thickness corresponding to the thickness (height) of the internal connection terminals 2. The unhardened under-filler-resin 13 is formed with clearance holes 13a having a shape similar to that of the internal connection terminals 2 terminals, provided in the positions of the terminals and is formed with recesses 13b for alignment.

Further, on the interposer (substrate) 3 that faces the recesses 13b, there is provided protrusions 14 which fit in the recesses 13b to achieve positioning in cooperation with the recesses 13b.

A method of manufacturing a CSP structure having the above-described configuration will now be described.

First, the internal connection terminals 2 are mounted to input/output terminals of the semiconductor chip 1.

Then, the unhardened under-filler-resin 13 is placed on the interposer (substrate) 3 having the internal connection terminals 2 mounted thereon while positioning them using the alignment recesses 13b formed on the unhardened under-filler-resin 13 and the protrusions 14 formed on the interposer (substrate) 3.

Once the unhardened under-filler-resin 13 is accurately placed by means of such positioning, the semiconductor device is heated (at 100 to 200° C.) to melt and thermally harden the under-filler-resin 13, and the semiconductor chip 1 and the interposer (substrate) 3 are sealed with the under-filler-resin 8 obtained as a result of the thermal hardening. Like the third embodiment, since the guard ring 12 is provided around the unhardened under-filler-resin 13, it is possible to prevent the under-filler-resin 13 from flowing on to the interposer (substrate) 3 when the resin is melted.

As described above, according to the method of manufacturing a semiconductor device of the fourth embodiment, the alignment recesses 13b are formed on the unhardened under-filler-resin 13, and the protrusions 14 for performing positioning in cooperation with the recesses 13b are provided on the interposer (substrate) 3 that faces the recesses 13b. This makes it possible to improve alignment accuracy when the unhardened under-filler-resin 13 is loaded.

Although thermally hardening under-filler-resin is used as the hardening resin in the above-described embodiments, any type of resin may be employed as long as it is in the form of a sheet. Specifically, any type of hardening resin may be employed as long as it can be sandwiched between a semiconductor device and a substrate when they are bonded.

Further, the present invention is not limited to thermosetting resin and, for example, UV-hardening resin may be used.

In addition, although an interposer (substrate) constituted by a multilayer substrate is used as a substrate bonded to a semiconductor chip in the above-described embodiments, it is obvious that the present invention is not limited to multilayer substrates and that packaging can be performed in the same manner on, for example, a double-sided printed circuit board.

Moreover, although the above-described embodiments have referred to examples of the application of the invention to a CSP as a semiconductor device, the present invention may be applied to any semiconductor device as long as it is bonded on to a substrate. It will be obvious to those skilled in the art that the present invention can be applied to semiconductor devices and terminals of any shape and type.

Furthermore, the methods of manufacturing a semiconductor device according to the above-described embodiments are not limited to the manufacturing processes, the types of the chip substrate and semiconductor device package, the quantities of the connection terminals and the like, the arrangements around the packages and the like specified in the above-described embodiments.

What is claimed is that:

1. A method of manufacturing a semiconductor device comprising:

placing a sheet-shaped hardening resin between a semiconductor chip and a substrate;

melting said hardening resin; and re-hardening said melted hardening resin, thereby bonding said semiconductor chip and said substrate by said hardening resin, the surface of the semiconductor chip opposite to said substrate being covered with the hardening resin.

2. The method of manufacturing a semiconductor device according to claim 1, wherein said hardening resin placed between said semiconductor chip and said substrate is hardening resin in a solid state.

3. The method of manufacturing a semiconductor device according to claim 1, wherein said hardening resin is a thermosetting resin.

4. The method of manufacturing a semiconductor device according to claim 1, wherein said hardening resin is a UV-hardening resin.

5. The method of manufacturing a semiconductor device according to claim 1, further comprising placing connection terminals, which electrically connect said semiconductor chip and said substrate, between said semiconductor chip and substrate, the connection terminals being sealed by said hardening resin.

6. The method of manufacturing a semiconductor device according to claim 13, wherein said hardening resin is a UV-hardening resin.

7. The method of manufacturing a semiconductor device according to claim 1, wherein the surface of the semiconductor chip opposite to said substrate is completely covered with the hardening resin.

8. The method of manufacturing a semiconductor device according to claim 1, wherein said melting includes melting all of the hardening resin between the semiconductor chip and the substrate.

9. The method of manufacturing a semiconductor device according to claim 7, wherein said melting includes melting all of the hardening resin between the semiconductor chip and the substrate.

\* \* \* \* \*